US006472899B2

(12) United States Patent
Osburn et al.

(10) Patent No.: US 6,472,899 B2
(45) Date of Patent: Oct. 29, 2002

(54) METHOD FOR DETERMINING A LOAD LINE BASED VARIABLE VOLTAGE INPUT FOR AN INTEGRATED CIRCUIT PRODUCT

(75) Inventors: Edward P. Osburn, Folsom, CA (US); Michael A. Stapleton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 09/751,051

(22) Filed: Dec. 29, 2000

(65) Prior Publication Data

US 2002/0084798 A1 Jul. 4, 2002

(51) Int. Cl.⁷ .......................... G01R 31/28; G06F 19/00
(52) U.S. Cl. ........................ 324/765; 702/118
(58) Field of Search ................. 324/765, 768, 324/769; 702/117, 118, 120; 714/736

(56) References Cited

U.S. PATENT DOCUMENTS

| 4,637,020 A | * | 1/1987 | Schinabeck | 702/57 |
| 5,528,509 A | * | 6/1996 | Sawai et al. | 714/736 |
| 5,905,384 A | * | 5/1999 | Inoue et al. | 324/765 |
| 6,049,219 A | * | 4/2000 | Hwang et al. | 324/765 |

OTHER PUBLICATIONS

Intel Pentium III Processor for the PGA370 Socket at 500 MHz to 1 GHz Datasheet, Oct. 2000, pp. 1–80, Order No. 245264–007.

* cited by examiner

Primary Examiner—Ernest Karlsen
(74) Attorney, Agent, or Firm—Blakely, Sokoloff, Taylor & Zafman LLP

(57) ABSTRACT

The present invention provides a method or process for determining a load line based variable voltage input for an Integrated Circuit (IC) product. More particularly, the present invention provides a method/process for determining a variable load line that defines voltage input (Vcc) as a function of current draw (Icc) for an IC product. In one embodiment, the method includes defining a minimum voltage relative to a reference voltage level for an IC product at a maximum current draw Icc of the IC product. A maximum voltage relative to the reference voltage level for the IC product, at a minimum current draw Icc of the IC product, is also defined. Next, a load line based upon the maximum and minimum voltages and current draws, respectively, is calculated. The load line defines the voltage requirements for the IC product as a function of current draw Icc.

42 Claims, 4 Drawing Sheets

METHOD FOR DETERMINING A LOAD LINE BASED VARIABLE VOLTAGE INPUT FOR AN INTEGRATED CIRCUIT PRODUCT

BACKGROUND

1. Field of the Invention

This invention relates to integrated circuit products. More particularly, the invention relates to a method or process for determining a load line based variable voltage input for an integrated circuit product.

2. Description of Related Art

Integrated Circuit (IC) products (e.g. processors, central processing units (CPU), chipsets, graphic chips, etc.) generally require a voltage input (often termed a voltage core input (Vcc)) from a voltage regulator to operate. This voltage input (Vcc) is complimented by a current input (Icc), which results from the voltage Vcc and the IC product's effective impedance. This current Icc input can vary across IC product performance offerings where IC products of the same family but with higher internal clock frequencies typically draw more current Icc for a given voltage input (Vcc). In today's cost effective IC product designs, typically, as the current draw Icc increases, the IC product's input voltage Vcc tends to decrease, due to the voltage droop of path parasitics and regulator and capacitor resistances. Furthermore, in order to maintain product performance and yield, IC products continuously require a minimum voltage closer to the nominal input voltage Vcc requirement set for the IC product (e.g. a Voltage Identifier (VID) setting for CPU's). This becomes even more pronounced as voltage input (Vcc) levels decrease due to silicon process improvements and size reductions, as keeping the same input voltage range would require a larger percentage of the operational voltage level as voltage decreases. Excessive voltage droop can result in an unstable IC product due to speed path issues. However, directly compensating for tighter voltage regulation ranges results in a significant cost increase in the voltage regulator and can impact the viability of the IC product.

Unfortunately, current design practice is to specify a set non-varying minimum and maximum input voltage Vcc requirement for all Icc load in IC product specifications, which does not take into account that in today's IC products, as current draw Icc increases, the IC product's input voltage Vcc tends to decrease. Accordingly, absolute maximum and minimum voltage specifications apply to any current draw Icc which allows significantly different voltage regulator performance from manufacturer to manufacturer and from design to design. Moreover, voltage and current are not correlated and all IC products need to be manufactured and tested based upon the single worst-case maximum and minimum voltage specifications.

BRIEF DESCRIPTION OF THE DRAWINGS

The features and advantages of the present invention will become apparent from the following description of the present invention in which.

DESCRIPTION

Figure 1:
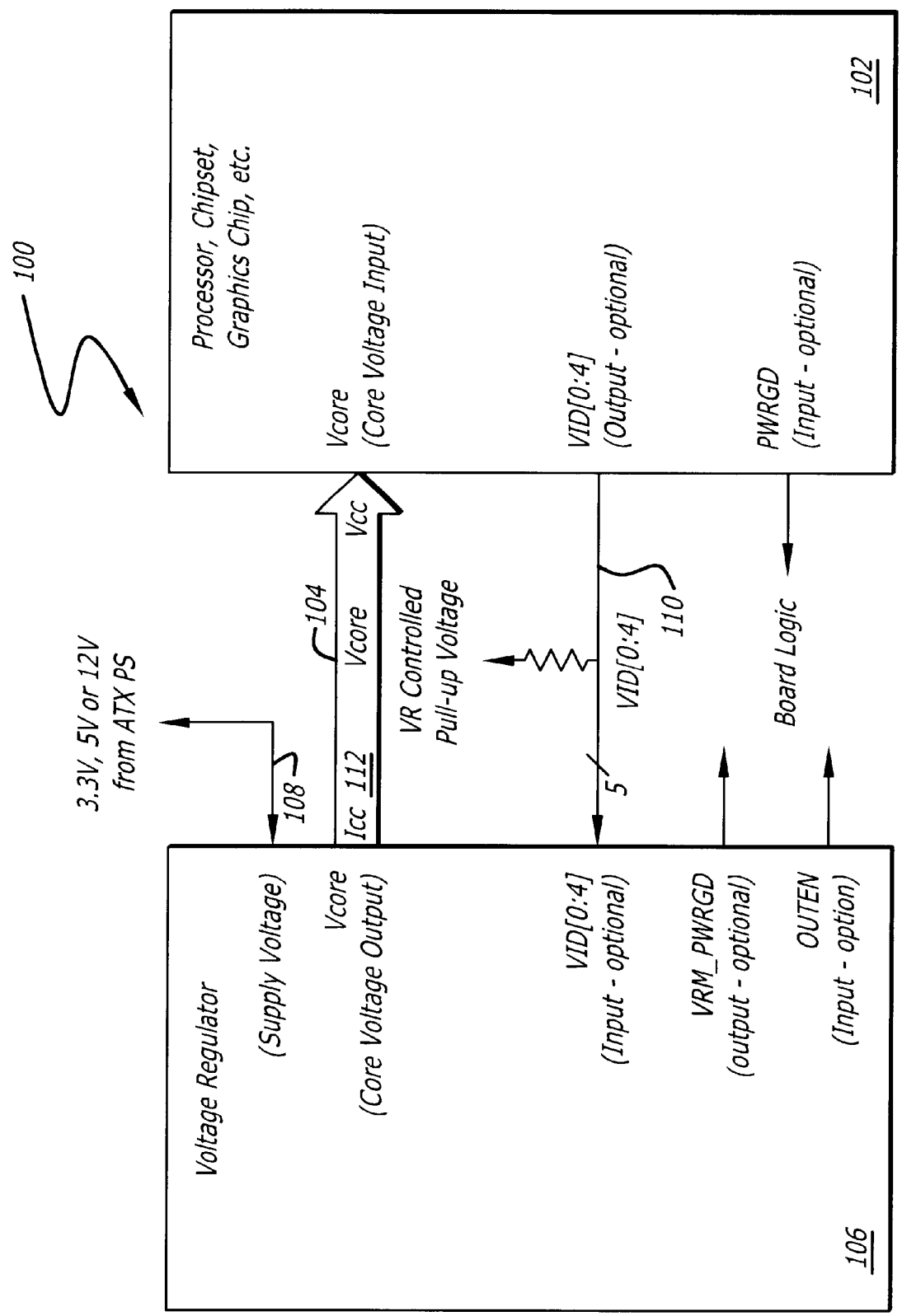
FIG. 1 is a block diagram illustrating an exemplary environment of a voltage regulator and an Integrated Circuit (IC) product.

Embodiments of the present invention provide a method or process for determining a load line based variable voltage input for an Integrated Circuit (IC) product. More particularly, embodiments of the present invention provide a method/process for determining a variable load line that defines voltage input (Vcc) as a function of current draw (Icc) for an IC product. In one embodiment, the method includes defining a minimum voltage relative to a reference voltage level for an IC product at a maximum current draw Icc of the IC product. A maximum voltage relative to the reference voltage level for the IC product, at a minimum current draw Icc of the IC product, is also defined. Next, a load line based upon the maximum and minimum voltages and current draws, respectively, is calculated. The load line defines the voltage requirements for the IC product as a function of current draw Icc.

Thus, in its most general form, an embodiment of the invention incorporates the increasing current levels and the resulting voltage droops of today's IC products as a design parameter for product voltage requirements. As a result, voltage requirements vary as a function of current draw Icc over the maximum possible range. Accordingly, as an IC product's current draw increases, the required operating voltage range shifts down. The full range of operating conditions, minimum Icc and maximum Icc, for any given IC product then defines the absolute maximum and minimum operating voltage inputs (Vcc's). The combination of these design parameters, as well as other design parameters to be discussed, can be used to define the input voltage requirements for the IC product as a function of current draw Icc. Moreover, by requiring input voltage requirements to droop as the current draw Icc increases, IC product yield can be increased over current yields due to higher input voltage (Vcc) levels at currents lower than the product family's maximum projected Icc. Therefore, the method/process of one embodiment of the present invention, instead of attempting to directly solve the voltage droop design issues resulting from current draw, accepts them and provides a means of delivering the required input voltage to the IC product within acceptable bounds and with less cost on the voltage regulator.

In the following description, the various embodiments of the present invention will be described in detail. However, such details are included to facilitate understanding of the invention and to describe exemplary embodiments for implementing the invention. Such details should not be used to limit the invention to the particular embodiments described because other variations and embodiments are possible while staying within the scope of the invention. Furthermore, although numerous details are set forth in order to provide a thorough understanding of the present invention, it will be apparent to one skilled in the art that these specific details are not required in order to practice the present invention. In other instances details such as, well-known electrical structures and circuits, are shown in block diagram form in order not to obscure the present invention.

FIG. 1 is a block diagram illustrating an exemplary environment 100 for a voltage regulator and an Integrated Circuit (IC) product. As shown in FIG. 1, an Integrated Circuit (IC) product 102 (e.g. a processor, central processing unit (CPU), chipset, graphics chip, etc.) receives a voltage input 104 (termed a voltage core input (Vcc)) from a voltage regulator 106. The voltage regulator 106 connects to a power supply of a board or a socket (not shown), to which it is coupled, to receive a supply voltage 108 (e.g. 3.3 V, 5V, or 12V) to power the voltage regulator 106. The voltage regulator 106 provides the Vcc input voltage 104 and complimentary Icc input current 112 to the IC product 102, which enables it to operate. Typically, the IC product 102 (e.g. a CPU) will send a Voltage Identifier (VID) setting 110 to the voltage regulator 106. The VID setting 110 instructs the voltage regulator 106 as to what reference input voltage Vcc 104 is required to be applied by the voltage regulator to the IC product for proper operation of the IC product. FIG. 1 also shows other various input/outputs of the IC product and voltage regulator. It should be appreciated that this is only exemplary environment for a voltage regulator and an Integrated Circuit (IC) product and should not be used to limit the present invention.

Figure 2:
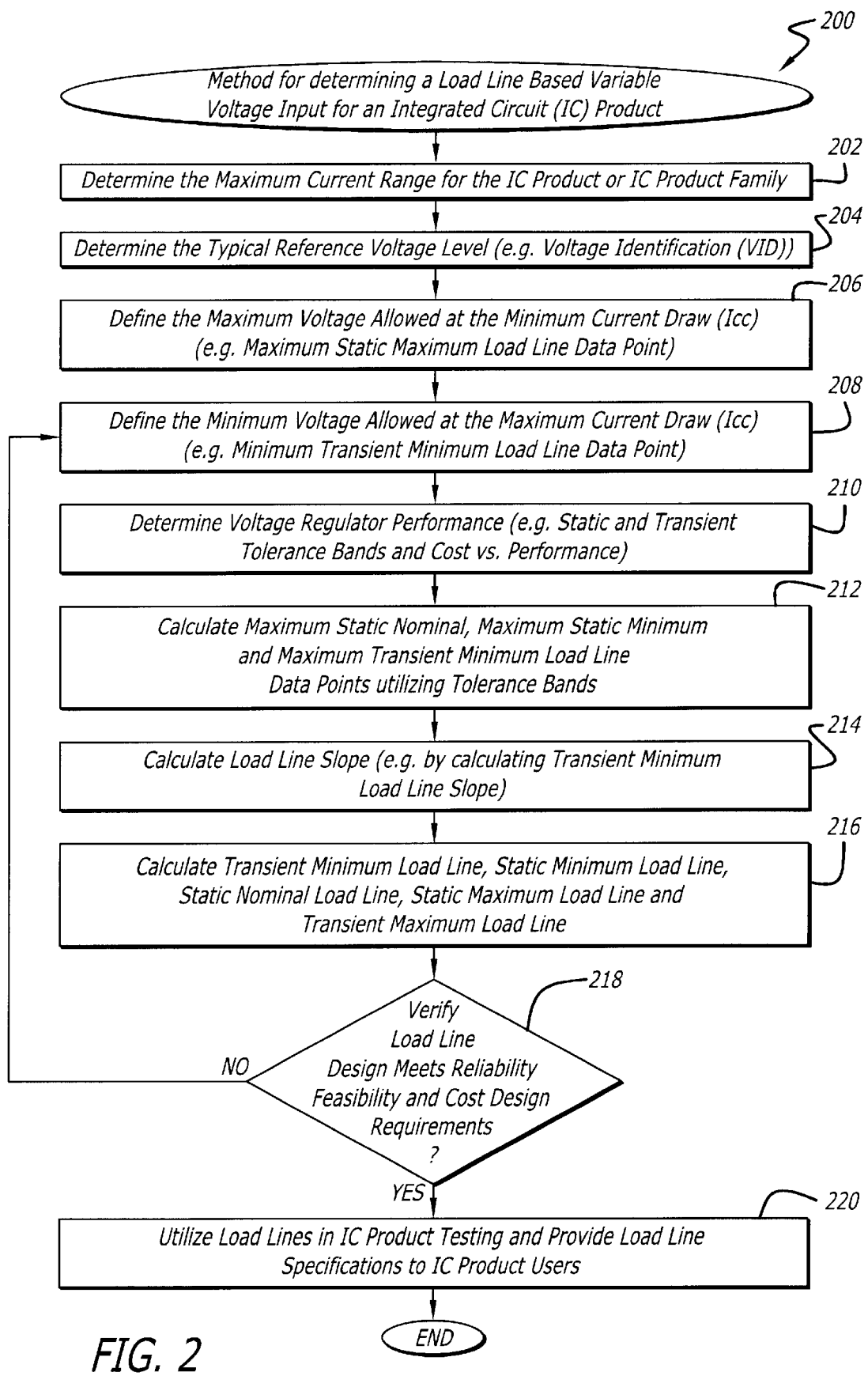
FIG. 2 is a flowchart illustrating a process for determining a variable load line that defines voltage input as a function of current draw (Icc) for an Integrated Circuit (IC) product according to one embodiment of the present invention.
Figure 3:
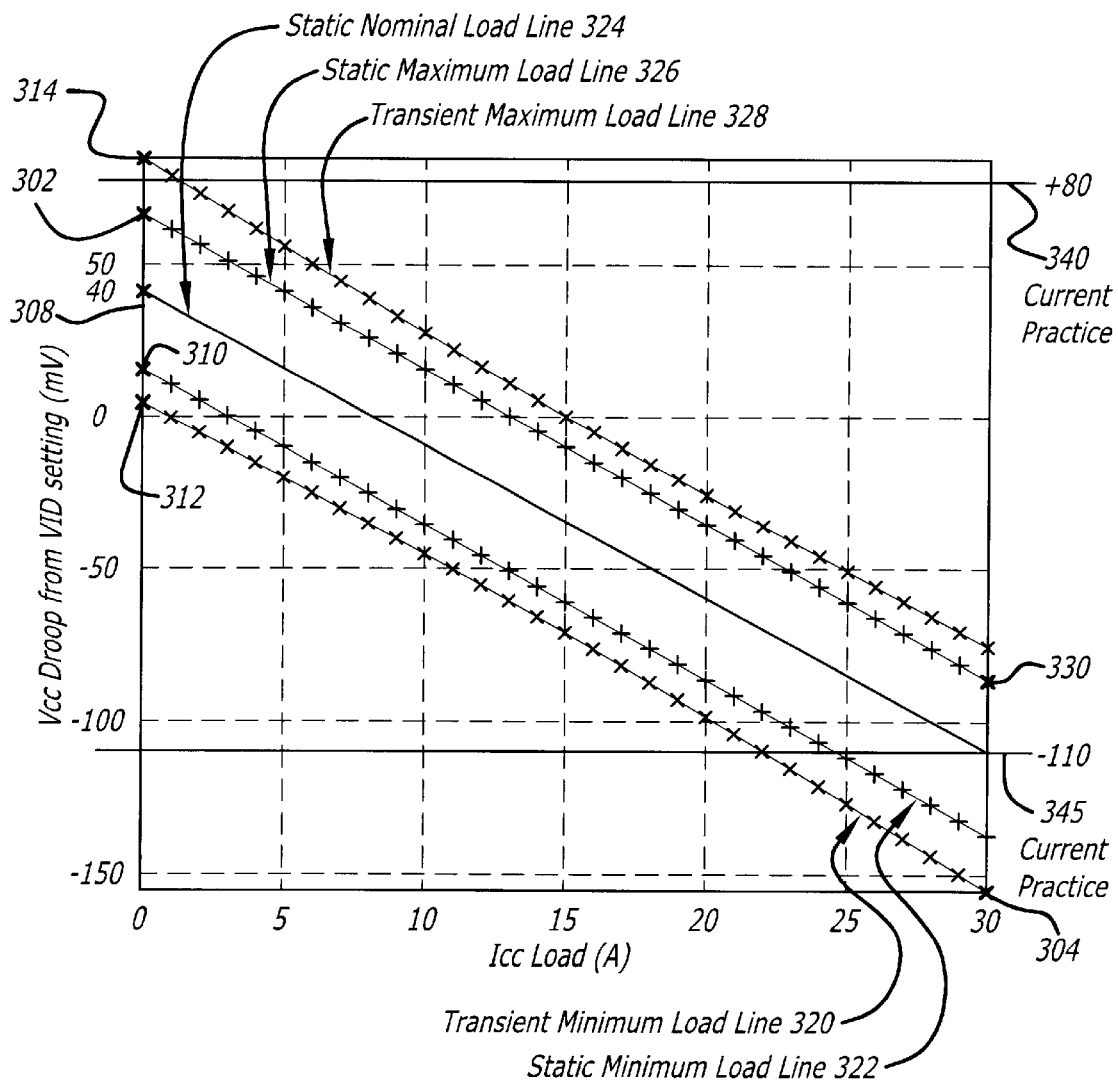
FIG. 3 is a graph illustrating an example of a plurality of variable load lines defining input voltage requirements as a function of current draw (Icc) for an Integrated Circuit (IC) product according to one embodiment of the present invention.

FIG. 2 is a flowchart illustrating a process for determining a variable load line that defines voltage input as a function of current draw (Icc) for an Integrated Circuit (IC) product according to one embodiment of the present invention. FIG. 3 is a graph illustrating an example of a plurality of variable load lines defining input voltage requirements as a function of current draw (Icc) for an Integrated Circuit (IC) product according to one embodiment of the present invention. A method or process 200 for determining a variable load line that defines voltage input as a function of current draw (Icc) for an Integrated Circuit (IC) product will now be discussed with reference to FIG. 2 in conjunction with FIG. 3.

The process 200 first begins by determining the maximum current range for the Integrated Circuit (IC) product or product family (e.g. Pentium III processors from 533 MHz to 1064 MHz) (block 202). For example, as shown in FIG. 3, the maximum current Icc load is 30 Amps (A) (at the far right end of the x axis). Next, the typical reference voltage level for the IC product is determined (block 204). For example, the reference voltage may be found by the voltage identification VID setting of the IC product. Note, the VID setting may be changed to move the reference voltage up or down over the life of the product as needed. As can be seen in FIG. 3, this corresponds to the 0 point of the y axis. In the following example, it is assumed that the VID setting is 1.60 V. The y axis illustrates the Vcc droop (plus/minus offset) from the VID setting in millivolts (mV).

At a block 206, the process 200 defines the maximum voltage allowed at the minimum current draw Icc. As shown in FIG. 3, a maximum static maximum load line data point 302 is defined to be offset approximately 65 mV from the VID setting, or at approximately 1.665 V. The maximum static maximum load line data point 302 sets the maximum on how high the voltage on the IC product can go, with zero current load Icc, with the IC product still operating within product reliability requirements.

Next, at block 208, the process 200 defines the minimum voltage allowed at the maximum current draw Icc. As shown in FIG. 3, a minimum transient minimum load data point 304, at the maximum current draw Icc (e.g. 30 amps), is defined to be offset approximately −160 mV from the VID setting, or at approximately 1.44 V. Because the critical factor in stable operation of an IC product is the minimum voltage level at any given operational state, the primary goal for stable operation is to ensure that input voltage levels are above the minimum level under worst-case conditions. Thus, if the voltage is required to droop with increasing current levels, then the worst-case voltage Vcc occurs at the worst case current draw Icc for a given IC product. In this example, this occurs at approximately −160 mV, with a current draw of 30 amps, at the minimum transient minimum load data point 304.

The process 200 then determines voltage regulator performance (block 210). Some of the criteria used in determining the voltage regular performance include the tolerances for a voltage regulator, e.g. the static and transient tolerance bands of a voltage regulator. For example, a voltage regulator may be able to control 0 to 30 amps of Icc load during a static state with a certain tolerance band and during transient states (e.g. during a change in current Icc levels) within another tolerance band. Other parameters used in determining voltage regulator performance include the amount of ripple voltage (e.g. oscillations due to regulator switching), power path parasitics (inductance, capacitance and resistance), as well as, the cost of the voltage regulator vs. the performance of the voltage regulator (e.g. amount and type of decoupling capacitors and voltage regulator component tolerances). The tolerance bands are added together to determine tolerance ranges for the voltage regulator, which are used in determining data points for defining load lines. Next, the maximum static nominal load line data point, the maximum static minimum load line data point, and the maximum transient minimum load line data point can be calculated utilizing the tolerance bands (block 212).

As an example, assuming the static tolerance band for the voltage regulator comes out to be an approximately 50 mV window (e.g. approximately +/−25 mV from nominal due to voltage regulator tolerances and feedback component tolerances), then the maximum static nominal load line data point and the maximum static minimum load line data point can be calculated utilizing this tolerance band. Because the maximum static maximum load line data point has previously been determined to be approximately +65 mV (from the VID setting), the maximum static nominal load line data point can be easily calculated as approximately +40 mV (from the VID setting). Thus, the maximum static nominal load line data point is approximately 25 mV less than the maximum static maximum load line data point previously calculated. The maximum static nominal load line data point 308 is shown in FIG. 3. Likewise, the maximum static minimum load line data point can be easily calculated as being approximately −25 mV less than the maximum static nominal load line data point, or approximately +15 mV (from the VID setting). The maximum static minimum load line data point 310 is shown in FIG. 3.

Continuing with the current example, assuming the transient tolerance band for the static minimum voltage is approximately −10 mV, then the maximum transient minimum load line data point can be easily calculated as being approximately 10 mV less than the maximum static minimum load line data point 310, or approximately +5 mV (from the VID setting). The maximum transient minimum load line data point 310 is the result of expected voltage Vcc transient levels due to current Icc transitions to that load (Icc) level and/or at that Icc level based on static minimum load line 322 operation and voltage regulator 106 decoupling expectations. The maximum transient minimum load line data point 312 is shown in FIG. 3. On the other hand, assuming the transient tolerance band for the static maximum voltage is approximately +20 mV, then the maximum transient maximum load line data point can be easily calculated as being approximately 20 mV greater than the maximum static maximum load line data point 302, or approximately +85 mV (from the VID setting). The maximum transient maximum load line data point 312 is the result of expected voltage Vcc transient levels due to current Icc transitions to that load (Icc) level and/or at that Icc level based on static maximum load line 326 operation and voltage regulator 106 decoupling expectations. The maximum transient maximum load line data point 314 is shown in FIG. 3. Thus, all the data points on the left-hand side of the graph shown in FIG. 3 have been calculated.

Now the process 200 calculates the load line slope (block 214). For example, the transient minimum load line slope can be calculated since the maximum transient minimum load line data point 312 and the minimum transient minimum load line data point 304 are known. FIG. 3 shows the transient minimum load line 320 and its associated slope. Using the calculated transient minimum load line slope, other load lines, having the same or similar slope, can then be calculated. Not all load lines maintain the same slope or linearity. Some load lines may have different slopes or even be somewhat non-linear to account for variations due to current Icc effects that change with Icc magnitude (e.g. the transient minimum 320 and maximum 328 load lines flair out at the high current and low current levels respectively to account for load Icc change variations and their affects on voltage transients).

For example, the process 200, utilizing the same slope, can then calculate a static minimum load line 322, a static nominal load line 324, a static maximum load line 326, and a transient maximum load line 328 as shown in FIG. 3 (block 216). These load lines can then be adjusted or optimized to take into account other factors such as different tolerance bands, different ripple voltages, cheaper or more expensive voltage regulators, different VID settings, or other factors.

Once the initial load lines are developed, they must be checked against the design targets for reliability, feasibility and voltage regulator cost (block 218). If they meet all the design parameters, then process 200 can continue to block 220. If these design parameters are not met then process 200 must return to block 208 to re-evaluate the voltage levels, tolerances, and the resultant load line slopes. This return to block 208 could result from a voltage range that is not feasible given the design's power path parasitics or available voltage regulator performance capabilities. Conversely, the voltage range may be larger than necessary and might be tightened to increase voltage levels without adversely impacting voltage regulator cost. Finally, validation data may indicate that reliability design targets are not being met and the load lines must be adjusted to compensate.

The final calculated transient minimum, static minimum, static nominal, static maximum, transient maximum load lines can then be used for Integrated Circuit (IC) product testing and can be provided to IC product users for use in their products (block 220), as will be discussed in greater detail later. Although the process 200 has been described as calculating transient minimum, static minimum, static nominal, static maximum, and transient maximum load lines and finding the slope for the load lines using the transient minimum load line, it should be appreciated that this is only one example. In its most basic form, an embodiment of the present invention provides a method or process for determining a variable load line that defines voltage input (Vcc) as a function of current draw (Icc) for an IC product by defining a minimum voltage at a maximum current draw and maximum voltage at a minimum current draw for the IC product and then calculating the load line and load line slope accordingly such that the load line defines the voltage requirements for the IC product as a function of current draw Icc. The full range of operating conditions, minimum Icc and maximum Icc, for any given IC product then defines the absolute maximum and minimum operating voltage inputs (Vcc's).

Due to IC product operating requirements, there may be several voltage specifications or load lines defined by the process 200. For example, Intel® processors specify both Static Voltage and Transient Voltage requirements in addition to a "typical" or "reference" voltage, which is determined by Voltage Identification (VID) signals. These Static and Transient voltage requirements, as previously described, are then specified relative to the VID setting. The critical load line specifications are the static maximum load line 326, static minimum load line 322, transient maximum load line 328, and transient minimum load line 320. The static nominal load line 324 can also be calculated, as previously described. The importance and characteristics of these load lines will now be discussed in detail.

The static maximum load line 326 defines the maximum allowed voltage to be applied to the IC product under static load conditions. Due to voltage and temperature affects on product reliability, this load line affects the maximum voltage that can be delivered while maintaining product reliability requirements. The static maximum load line 326 maintains the same slope as the static nominal load line 324 with a positive offset that accounts for voltage regulator offset, tolerance, and ripple voltage.

The static minimum load line 320 defines the minimum allowed voltage to be applied to the IC product under static load conditions. Due to voltage affects on product stability, this load line affects the minimum voltage that can be delivered to ensure product stability over all operating conditions. The static minimum load line 320 maintains the same slope as the static nominal load line 324 with a negative offset that accounts for voltage regulator offset, tolerance, and ripple voltage.

The static nominal load line 324 defines the design target for the voltage regulator under optimal conditions with no tolerance variations with the ripple voltage (oscillations due to regulator switching) centered on it. The static nominal load line 324 then provides the foundation for setting the slope of the voltage regulator droop (voltage drop Vcc relative to current draw Icc). This slope affects the impedance and decoupling requirements of a voltage regulator design.

The transient maximum load line 328 defines the maximum allowed voltage to be applied to the IC product under transient load conditions. Due to voltage and temperature affects on product reliability, this load line affects the maximum voltage that can be delivered within the defined transient time window, while maintaining product reliability requirements. Its slope resembles the static load lines with variations due to an increasing allowance resulting from increasing transient conditions. The transient maximum load line 328 accounts for voltage delivered due to an unload transient condition and within the IC product's transient window definition.

The transient minimum load line 320 defines the minimum allowed voltage to be applied to the IC product under transient load conditions. Due to voltage affects on product stability, this load line affects the minimum voltage that can be delivered within the defined transient time window, while ensuring product stability. Its slope resembles the static load lines with variations due to an increasing allowance resulting from increasing transient conditions. The transient minimum load line 320 accounts for voltage delivered due to a load-on (low to high Icc change) transient condition and within the IC product's transient window definition.

Figure 4:
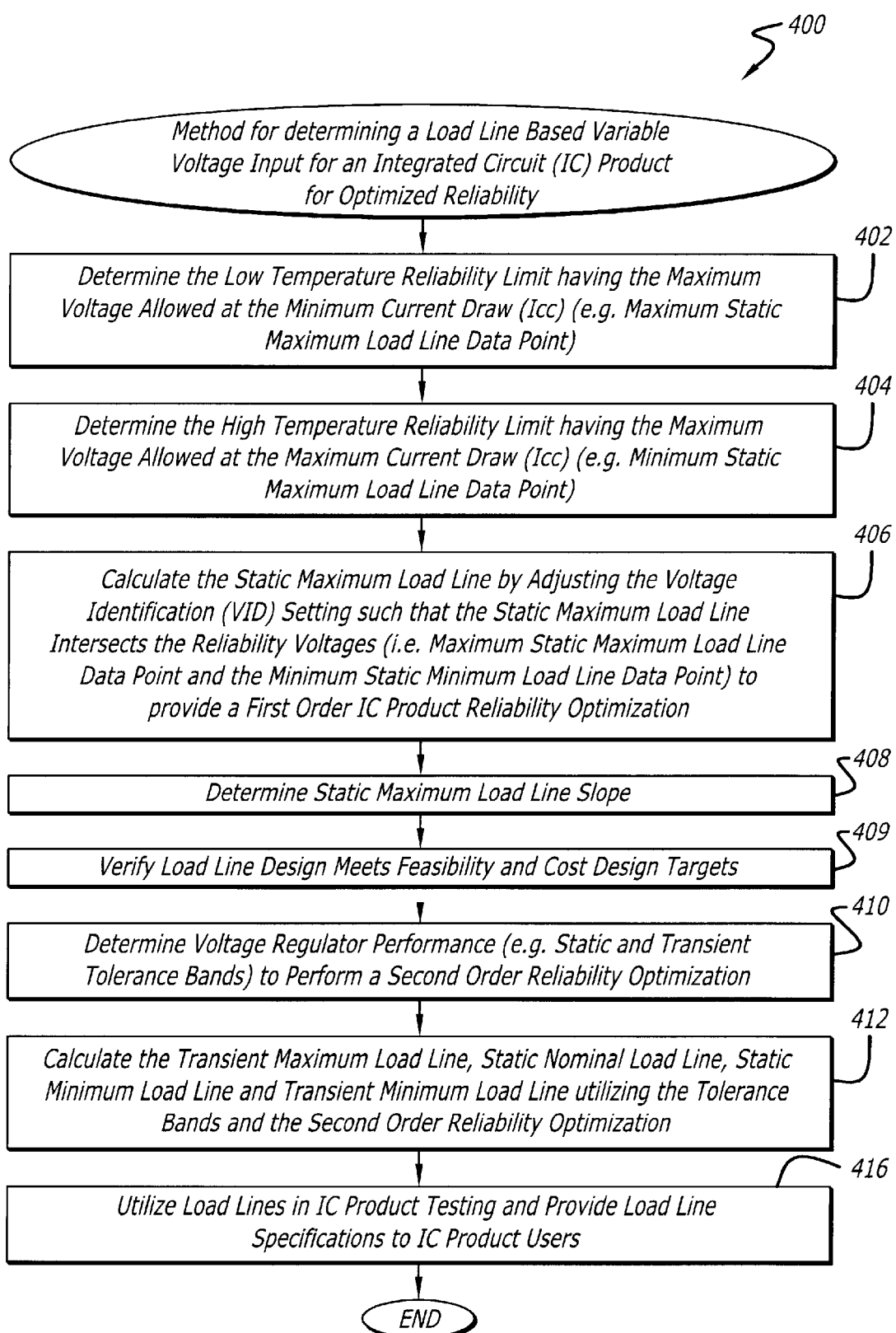
FIG. 4 is a flowchart illustrating a process for determining a variable load line that defines voltage input as a function of current draw (Icc) for an Integrated Circuit (IC) product for optimized reliability according to another embodiment of the present invention.

FIG. 4 is a flowchart illustrating a process 400 for determining a variable load line that defines voltage input as a function of current draw (Icc) for an Integrated Circuit (IC) product for optimized reliability according to another embodiment of the present invention. The process 400 is very similar to the process 200, previously described, and can be used as a supplement to process 200 to emphasize optimized IC product reliability. Common method steps of process 200 are not necessarily redescribed in the description of process 400 for brevity's sake. The method/process 400 for determining a variable load line that defines voltage input as a function of current draw (Icc) for an Integrated Circuit (IC) product for optimized reliability will now be discussed with reference to FIG. 4 in conjunction with FIG. 3.

The process 400 optimizes reliability by dropping worst case voltage as Icc load increases to improve reliability and then optimizes (pushes reliability margins closer to design targets) by raising the VID setting. A nominal VID setting is assumed and the process determines an optimized VID setting. The goal of process 400 is to obtain a IC product reliability as close to the design goals as possible to improve yield and product performance. One part of the process 400 is the control of the maximum voltage applied to the product as a function of Icc load such that as Icc load increases, maximum voltage decreases. A second part of the process 400 is the ability to raise the overall voltage limit without impacting reliability to improve product yield.

IC product reliability (expected time to product failure) results from several factors including voltage, temperature and time. The total reliability of an IC product is a time-based summation of operational voltage and temperature. Thus, it is important to determine the allowable temperature range of the product in order to determine what the allowable range of voltage levels are for the required life expectancy of the product. Since time is a significant element in the reliability calculation and is typically on the order of years, voltage transients, which have time durations on the order of microseconds, do not produce a significant effect on reliability provided that the voltage transients are limited to reasonable levels (e.g. excessively high voltage transients could reduce the IC product reliability and damage the product).

For process 400, there are two critical reliability limits of interest, Low Temperature and High Temperature. The Low Temperature reliability limit corresponds to the low current Icc load condition due to low power consumption, which then determines the highest allowable voltage Vcc under low loading conditions. The other is the High Temperature reliability limit. The High Temperature reliability limit corresponds to the maximum current Icc load condition, which then determines the highest allowable voltage Vcc under maximum loading conditions. Because of the significant difference in temperature between the Minimum and the Maximum loading conditions, the reliability voltages differ significantly and provide an opportunity to optimize the load line design for reliability.

Accordingly, the process 400 first determines the low temperature reliability limit having the maximum voltage allowed at the minimum static current draw (Icc) (block 402). As shown in FIG. 3, a maximum static maximum load line data point 302 is defined to be offset approximately 65 mV from the nominal VID setting (again assuming a nominal VID setting of 1.6 V), or at approximately 1.665 V. The maximum static maximum load line data point 302 sets the maximum on how high the voltage on the IC product can go, with zero current load Icc, with the IC product still operating reliably over its life expectancy.

Next, the process 400 determines the high temperature reliability limit having the maximum voltage allowed at the maximum static current draw (Icc) (block 404). As shown in FIG. 3, a minimum static maximum load line data point 330, at the maximum current draw Icc (e.g. 30 amps), is defined to be offset approximately −80 mV from the nominal VID setting, or at approximately 1.52 V. Depending upon what Icc level the allowed high temperature and corresponding thermal solution corresponds to, the high temperature reliability static current draw (Icc) level may be lower than the maximum static current draw (Icc) defined by the load lines (e.g. may be less than the maximum Icc level of 30A shown in FIG. 3). Because of this lower current level having to meet the high temperature reliability voltage, the slope of the load lines may be altered significantly. Now that these reliability voltages and Icc levels are known, the optimized Voltage Identification (VID) setting or "reference" voltage, the optimized VID offset voltage, and the slope of the static maximum load line can be determined.

The optimized reliability condition is configured for the worst case operating conditions over the entire product life to ensure adequate reliability across all product offerings. This requires that the static maximum load line intersect with the reliability Low and High Temperature points based on the highest possible VID setting. Thus, the static maximum load line is designed to intersect the Low Temperature reliability voltage ($V_{RLT}$) at $I_{CC\_MIN}$ 302 and/or intersect the High Temperature reliability voltage ($V_{RHT}$) at $I_{CC\_MAX}$ 330 (or some maximum Icc level corresponding to the high temperature thermal condition) by finding the optimized VID setting. Accordingly, the process 400 adjusts the VID setting such that the static maximum load line 326 intersects the reliability voltages (i.e. the maximum static maximum load line data point 302 and the minimum static maximum load line data point 330) to provide a first order IC product reliability optimization (block 406). Based on the previous information on the impact of transient events on reliability, the reliability voltage intersection points may be placed on the static maximum load line 326 providing a first level reliability optimization. By adjusting the VID setting such that the static maximum load line intersects the reliability voltages, to find an optimized VID setting, first order product reliability may be obtained.

Next, the process 400 determines the static maximum load line slope (block 408). The static maximum load line slope can be calculated since the maximum static maximum load line data point 302 and the minimum static maximum load line data point 330 are known. FIG. 3 shows the static maximum load line 326 and its associated slope. Using the calculated static maximum load line slope, other load lines, having the same or similar slope, can then be calculated. These load lines are an optimized solution and must be evaluated to determine feasibility.

The feasibility and cost targets then get analyzed in block 409 to ensure that the optimized reliability load lines can be obtained without exceeding voltage regulator cost restrictions and still maintain product yield and performance targets. If any of these design targets are violated, the load line slopes and tolerances may need to be adjusted to compensate. The result of these adjustments may result in a set of load lines that intersects only one of the reliability voltage points, either the Low Temperature reliability voltage ($V_{RLT}$) at $I_{CC\_MIN}$ 302 or the High Temperature reliability voltage ($V_{RHT}$) at $I_{CC\_MAX}$ 330.

The process 400 then determines voltage regulator performance to perform a second order reliability optimization (block 410). Some of the criteria used in determining the voltage regular performance include the tolerances for a voltage regulator, e.g. the static and transient tolerance bands of a voltage regulator. For example, a voltage regulator may be able to control 0 to 30 amps of Icc load during a static state with a certain tolerance band and during transient states (e.g. during a change in current Icc levels) within another tolerance band. Other parameters used in determining voltage regulator performance include the amount of ripple voltage (e.g. oscillations due to regulator switching), power path parasitics (inductance, capacitance and resistance), as well as, the cost of the voltage regulator vs. the performance of the voltage regulator (e.g. amount and type of decoupling capacitors and voltage regulator component tolerances). Further discussions of voltage regulator performance are discussed with reference to process 200. Moreover, voltage regulator ripple may be investigated to determine a corresponding effective voltage that is equivalent to the cumulative impact on reliability. Additionally, the distribution of voltage regulator tolerance, above the nominal toward the 0.8% or 1.0% limit, may be analyzed to build a failure model. The failure model would then project failure rates if static maximum voltage levels were adjusted above the reliability limit and into the regulator tolerance region. The combination of these factors might provide acceptable margins to adjust VID settings above projected levels to further optimize reliability for increased yield and/or increased performance.

The process 400, utilizing the slope of the static maximum load, the tolerance bands, and the second order reliability optimization can then calculate the transient maximum load line 328, the static nominal load line 324, the static minimum load line 322, and the transient minimum load line 320 as shown in FIG. 3 (block 412). These load lines can then be adjusted or optimized to take into account other factors such as different tolerance bands, different ripple voltages, cheaper or more expensive voltage regulators, different VID settings, or other factors. The calculated transient minimum, static minimum, static nominal, static maximum, transient maximum load lines can then be used for Integrated Circuit (IC) product testing and can be provided to IC product users for use in their products (block 416), as will be discussed in greater detail later. Although the process 400 has been described as calculating transient minimum, static minimum, static nominal, static maximum, and transient maximum load, it should be appreciated that this is only one example.

As discussed before, due to IC product operating requirements, there may be several voltage specifications or load lines defined by the process 400. For example, Intel® processors specify both Static Voltage and Transient Voltage requirements in addition to a "typical" or "reference" voltage, which is determined by Voltage Identification (VID) signals. These Static and Transient voltage requirements, as previously described, are then specified relative to the VID setting. The critical load line specifications are the static maximum load line 326, static minimum load line 322, transient maximum load line 328, and transient minimum load line 320. The static nominal load line 324 can also be calculated, as previously described. The importance and characteristics of these load lines have been discussed in detail, previously.

Reliability may not be the only product design parameter that may be optimized by a load line implementation. Depending upon the IC product performance levels (leading edge performance vs. low end consumer usage), market environment (high performance vs. low cost), available support components (e.g. heat-sinks, voltage regulators) and other factors, product design parameters such as IC product yield, Voltage Regulator cost, and Power consumption (thermal design) may also be optimized.

The testing of IC products utilizing the load line(s) will now be discussed. Because the critical factor in stable operation of an IC product is the minimum voltage level at any given operational state, the primary goal for stable operation is to ensure that input voltage levels are above the minimum level under worst-case conditions. Thus, if the voltage is required to droop with increasing current levels, then the worstcase voltage Vcc occurs at the worst case current draw Icc for a given IC product. In the example of FIG. 3, this occurs at approximately −160 mV with a current draw of approximately 30 amps at the minimum transient minimum load data point 304. While Icc draw may vary across product volume, revisions and performance improvements, the load line(s) provide a fixed reference to guarantee voltage regulator performance and thus, adequate voltage. As a result, products may be designed and tested to a voltage level that is based upon their worst-case current draw rather than an overall product family's worst-case current draw. This would result in significant differences in input voltages for IC testing. An example would be a product with a maximum current level of 20A being tested at voltages based on a 20A current Icc draw rather than at 30A (the worst case product family current Icc draw). The difference based on FIG. 3 would be approximately 60 mV higher test voltage, which would increase yield and shift the resulting yield to the high frequency end of the distribution.

When applying the load line(s) to a product with many performance levels, manufacturing tester settings will depend upon projected or tested worst-case current draw Icc levels. Since Icc may change significantly from the lowest performance offering to the highest performance offering, tester settings will change based upon worst case Icc draw for the performance offerings being manufactured. If validation testing of maximum Icc draw shows lower than projected levels, the lower current levels can be used for determining tester settings. This provides higher voltages due to the lower currents, which results in higher yield (e.g. for integrated circuits the number of dies that come off a wafer). For example, if a part is expected to draw 20A maximum, but validation shows a worst case current draw of 18A, then manufacturing test levels would use voltages corresponding to the 18A level rather than the 20A level. The result is approximately 10 mV higher input voltage based on FIG. 3 (Transient Minimum Load Line 320).

The methods/processes 200 and 400 for determining a variable load line(s) that defines voltage input as a function of current draw (Icc) for an Integrated Circuit (IC) product, described above, provides many advantages. For example, an embodiment of the present invention improves IC product yield (e.g. for integrated circuits the number of dies that come off a wafer) by providing a varying voltage range based upon Icc draw. Because of this, low current parts are guaranteed to operate at a higher voltage, per VID setting, than higher current parts and thus may be tested at a higher voltage, which then increases yield. The yield improvements may come from a shift in the performance distribution toward higher frequency operation as well as a general increase in overall yield. This differs from current practice where voltage and current are not correlated and thus all products must be manufactured and tested based upon the single worst-case maximum and minimum voltage specifications. For example, as shown in FIG. 3, the current practice of a single worst maximum voltage specification across all Icc (e.g. at +80 mV) 340 and a single worst minimum voltage specification across all Icc (e.g. at −110 mV) 345 is shown. As shown in FIG. 3, utilizing the transient minimum load line 320 of the invention an IC product can be tested from +5 mV down to approximately −160 mV depending upon current Icc draw, whereas IC products tested under the current practice using a single worst minimum voltage specification 345 across all Icc can only be tested down to approximately −110 mV, thus the transient minimum load line 320 provides up to 115 mV of higher test voltage and an additional approximate 50 mV of extended testing should product current levels reach worst case expectations.

Thus, an embodiment of the invention provides improved control over voltage. Particularly, the embodiment of the invention better controls the IC product operating environment by defining both upper and lower voltage bounds for any given current that is supported. This differs from current practice where absolute maximum and minimum voltage specifications are given and might apply to any current draw, thus making it difficult to accurately predict the voltage that the product might experience under a specific set of conditions (e.g. operation state, temperature, and Icc level).

Further, an embodiment of the invention provides a more uniform operating environment across the industry by defining a relatively tight voltage band that corresponds to the full range of supported current levels. Thus, an IC product, operating at any given current level, can be guaranteed to be within this voltage range regardless of the manufacturer or design. This differs from current practice where the absolute maximum and minimum voltage specifications allow significantly different voltage regulator performance from manufacturer to manufacturer and from design to design.

Additionally an embodiment of the invention reduces the cost of the voltage regulator by enabling the voltage range between the minimum Icc draw and the maximum Icc draw to be optimized and expanded to maximum limits. These limits result from product reliability where voltage, Icc, temperature and reliability requirements combine to determine the upper and lower bounds. By providing the maximum voltage range possible for the voltage regulator to operate, the cost of the voltage regulator design is minimized. This differs from current practice where the maximum and minimum limits are based upon performance expectations.

Also, an embodiment of the invention by placing bounds on the maximum and minimum voltage for any given Icc provides for optimized reliability and increased product performance. As current increases, the maximum voltage an IC product will experience drops. In reliability analysis, this translates into reduced time to failure. Because these bounds incorporate voltage regulator tolerance and performance variations, a statistical model may be set up to analyze the distribution of voltage regulator performance. This analysis may then be applied to reliability factors and requirements to determine if "reference" voltage changes can be made to optimize both yield and reliability. This differs from current practice where the environment is less controlled due to the absolute maximum and minimum voltage specifications that apply to all current levels, which reduces the ability to analyze voltage regulator performance with any certainty, and results in an inability to optimize reliability and improve yield and performance.

Moreover, using an embodiment of the present invention, actual product VID settings may be changed to improve performance of the IC product. If yield is high and power is a significant factor, the VID setting may be set at the lower end of the allowable voltage range. If goals are to maintain yield and power levels, VID settings may be increased as product Icc levels increase to maintain a specific worst-case voltage level. If yield becomes the predominant design factor, the VID settings may be increased to the reliability limits as defined by the Low Temperature/Icc Minimum and High Temperature/Icc Maximum conditions. The invention also alleviates the impact of IC product roadmap changes and of pre-silicon and post-silicon Icc variations. If Icc is increased on an IC product, the load line(s) can be used to determine the correct reference voltage setting to guarantee adequate voltage delivery, rather than requiring all manufacturers to alter their designs to adjust to the higher current levels or to meet a new set of voltage specifications.

Although an embodiment of the invention, including the processes 200 and 400, have been described as calculating transient minimum, static minimum, static nominal, static maximum, and transient maximum load lines and finding the slope for the load lines using the transient minimum load line, it should be appreciated that this is only one example. In its most basic form, an embodiment of the present invention provides a method or process for determining a variable load line that defines voltage input (Vcc) as a function of current draw (Icc) for an IC product by defining a minimum voltage at a maximum current draw and maximum voltage at a minimum current draw for the IC product and then calculating the load line and load line slope accordingly such that the load line defines the voltage requirements for the IC product as a function of current draw Icc. Thus, in its most general form, an embodiment of the invention incorporates the increasing current levels and the resulting voltage droops of today's IC products as a design parameter for product voltage requirements. The full range of operating conditions, minimum Icc and maximum Icc, for any given IC product then defines the absolute maximum and minimum operating voltage inputs (Vcc's). Therefore, the method/process according to an embodiment of the present invention, instead of attempting to solve the voltage droop design issues resulting from current draw, accepts them and provides a means of delivering the required input voltage to the IC product within acceptable bounds and with less cost on the voltage regulator.

Further, while embodiments of the present invention and its various functional components have been described in particular embodiments, it should be appreciated the present invention can be implemented in hardware, software, firmware, middleware or a combination thereof and utilized in systems, subsystems, components, or sub-components thereof. When implemented in software, the elements of the present invention are the code segments to perform the necessary tasks. The program or code segments can be stored in a machine readable medium, such as a processor readable medium or a computer program product, or transmitted by a computer data signal embodied in a carrier wave, or a signal modulated by a carrier, over a transmission medium or communication link. The machine-readable medium or processor-readable medium may include any medium that can store or transfer information in a form readable and executable by a machine (e.g. a processor, a computer, etc.). Examples of the machine/processor-readable medium include an electronic circuit, a semiconductor memory device, a ROM, a flash memory, an erasable programmable ROM (EPROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

While embodiments of this invention have been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
   defining a minimum voltage relative to a reference voltage level for an integrated circuit (IC) product at a maximum current draw (Icc) of the IC product;
   defining a maximum voltage relative to the reference voltage level for the IC product at a minimum current draw (Icc) of the IC product; and
   calculating a load line based upon the maximum and minimum voltages and current draws, respectively, the load line defining voltage requirements for the IC product as a function of current draw (Icc).

2. The method of claim 1, wherein the reference voltage level is a voltage identification (VID) setting transmitted by the IC product.

3. The method of claim 1, wherein defining the maximum voltage relative to the reference voltage level for the IC product at the minimum current draw (Icc) of the IC product includes calculating a maximum static maximum load line data point.

4. The method of claim 1, wherein defining the minimum voltage relative to the reference voltage level for the IC product at the maximum current draw (Icc) of the IC product includes calculating a minimum transient minimum load line data point.

5. The method of claim 4, wherein calculating the load line includes determining voltage regulator performance.

6. The method of claim 5, wherein determining voltage regulator performance includes determining static tolerance bands and transient tolerance bands.

7. The method of claim 5, wherein a maximum transient minimum load line data point is calculated utilizing the voltage regulator performance.

8. The method of claim 7, wherein a transient minimum load line is defined using the maximum transient minimum load line data point and the minimum transient minimum load line data point.

9. The method of claim 8, further comprising calculating a load line slope based upon a slope of the transient minimum load line.

10. The method of claim 9, further comprising calculating at least one of a static minimum load line, a static maximum load line, a static nominal load line, or a transient maximum load line based upon the load line slope and the voltage regulator performance.

11. The method of claim 10, further comprising utilizing the load lines in testing the IC product.

12. A method comprising:
    determining a low temperature reliability limit at a maximum voltage, relative to a reference voltage level, allowed at a minimum current draw (Icc) for an integrated circuit (IC) product;
    determining a high temperature reliability limit at a maximum voltage, relative to the reference voltage level, allowed at a maximum current draw (Icc) for the integrated circuit (IC) product; and
    calculating a static maximum load line to provide a first order IC product reliability optimization based upon the maximum and minimum current draws and corresponding maximum voltages, respectively, the static maximum load line defining voltage requirements for the IC product as a function of current draw (Icc).

13. The method of claim 12, wherein the reference voltage level is a voltage identification (VID) setting transmitted by the IC product.

14. The method of claim 13, wherein calculating the static maximum load line to provide the first order IC product reliability optimization includes adjusting the VID setting such that the static maximum load line intersects the low temperature reliability limit and the high temperature reliability limit.

15. The method of claim 12, wherein defining the maximum voltage relative to the reference voltage level for the IC product at the minimum current draw (Icc) for the IC product includes calculating a maximum static maximum load line data point.

16. The method of claim 12, wherein defining the maximum voltage relative to the reference voltage level for the IC product at the maximum current draw (Icc) for the IC product includes calculating a minimum static maximum load line data point.

17. The method of claim 14, further comprising calculating a load line slope based upon a slope of the static maximum load line.

18. The method of claim 14, wherein calculating the static maximum load line includes determining voltage regulator performance to perform a second order reliability optimization.

19. The method of claim 17, wherein determining voltage regulator performance includes determining static tolerance bands and transient tolerance bands.

20. The method of claim 18, further comprising calculating at least one of a transient maximum load line, a static nominal load line, a static minimum load line, or a transient minimum load line based upon the load line slope, the voltage regulator performance, and the second order reliability optimization.

21. The method of claim 20, farther comprising utilizing the load lines in testing the IC product.

22. A machine-readable medium having stored thereon instructions, which when executed by a machine, causes the machine to perform operations comprising:
    defining a minimum voltage relative to a reference voltage level for an integrated circuit (IC) product at a maximum current draw (Icc) of the IC product;
    defining a maximum voltage relative to the reference voltage level for the IC product at a minimum current draw (Icc) of the IC product; and
    calculating a load line based upon the maximum and minimum voltages and current draws, respectively, the load line defining voltage requirements for the IC product as a function of current draw (Icc).

23. The machine-readable medium of claim 22, wherein the reference voltage level is a voltage identification (VID) setting transmitted by the IC product.

24. The machine-readable medium of claim 22, wherein defining the maximum voltage relative to the reference voltage level for the IC product at the minimum current draw (Icc) of the IC product includes calculating a maximum static maximum load line data point.

25. The machine-readable medium of claim 22, wherein defining the minimum voltage relative to the reference voltage level for the IC product at the maximum current draw (Icc) of the IC product includes calculating a minimum transient minimum load line data point.

26. The machine-readable medium of claim 25, wherein calculating the load line includes determining voltage regulator performance.

27. The method of claim 26, wherein determining voltage regulator performance includes determining static tolerance bands and transient tolerance bands.

28. The machine-readable medium of claim 26, wherein a maximum transient minimum load line data point is calculated utilizing the voltage regulator performance.

29. The machine-readable medium of claim 28, wherein a transient minimum load line is defined using the maximum transient minimum load line data point and the minimum transient minimum load line data point.

30. The machine-readable medium of claim 29, farther comprising calculating a load line slope based upon a slope of the transient minimum load line.

31. The machine-readable medium of claim 30, further comprising calculating at least one of a static minimum load line, a static maximum load line, a static nominal load line, or a transient maximum load line based upon the load line slope and the voltage regulator performance.

32. The machine-readable medium of claim 31, further comprising utilizing the load lines in testing the IC product.

33. A machine-readable medium having stored thereon instructions, which when executed by a machine, causes the machine to perform operations comprising:

determining a low temperature reliability limit at a maximum voltage, relative to a reference voltage level, allowed at a minimum current draw (Icc) for an integrated circuit (IC) product;

determining a high temperature reliability limit at a maximum voltage, relative to the reference voltage level, allowed at a maximum current draw (Icc) for the integrated circuit (IC) product; and calculating a static maximum load line to provide a first order IC product reliability optimization based upon the maximum and minimum current draws, and corresponding maximum voltages, respectively, the static maximum load line defining voltage requirements for the IC product as a function of current draw (Icc).

34. The machine-readable medium of claim 33, wherein the reference voltage level is a voltage identification (VID) setting transmitted by the IC product.

35. The machine-readable medium of claim 34, wherein calculating the static maximum load line to provide the first order IC product reliability optimization includes adjusting the VID setting such that the static maximum load line intersects the low temperature reliability limit and the high temperature reliability limit.

36. The machine-readable medium of claim 33, wherein defining the maximum voltage relative to the reference voltage level for the IC product at the minimum current draw (Icc) for the IC product includes calculating a maximum static maximum load line data point.

37. The machine-readable medium of claim 33, wherein defining the maximum voltage relative to the reference voltage level for the IC product at the maximum current draw (Icc) for the IC product includes calculating a minimum static maximum load line data point.

38. The machine-readable medium of claim 34, further comprising calculating a load line slope based upon a slope of the static maximum load line.

39. The machine-readable medium of claim 34, wherein calculating the static maximum load line includes determining voltage regulator performance to perform a second order reliability optimization.

40. The machine-readable medium of claim 38, wherein determining voltage regulator performance includes determining static tolerance bands and transient tolerance bands.

41. The machine-readable medium of claim 39, further comprising calculating at least one of a transient maximum load line, a static nominal load line, a static minimum load line, or a transient minimum load line based upon the load line slope, the voltage regulator performance, and the second order reliability optimization.

42. The machine-readable medium of claim 41, further comprising utilizing the load lines in testing the IC product.

* * * * *